(12) United States Patent
Chang

(10) Patent No.: US 7,694,725 B2
(45) Date of Patent: Apr. 13, 2010

(54) HEAT DISSIPATION SYSTEM

(75) Inventor: Jen-Tsorng Chang, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 774 days.

(21) Appl. No.: 11/433,656

(22) Filed: May 12, 2006

(65) Prior Publication Data
US 2007/0068654 A1   Mar. 29, 2007

(30) Foreign Application Priority Data
Sep. 23, 2005   (CN) ................. 2005 1 0037502

(51) Int. Cl.
F28D 15/00 (2006.01)
H05K 7/20 (2006.01)
(52) U.S. Cl. .................. 165/104.21; 165/80.4
(58) Field of Classification Search .............. 165/80.4, 165/104.21, 104.26, 104.33, 104.34; 361/699, 361/700, 704; 257/714, 715
See application file for complete search history.

(56) References Cited

U.S. PATENT DOCUMENTS

| 4,004,441 | A | | 1/1977 | Leszak |
| 5,731,954 | A | * | 3/1998 | Cheon ................ 361/699 |
| 6,437,981 | B1 | * | 8/2002 | Newton et al. ............. 361/700 |
| 6,529,377 | B1 | * | 3/2003 | Nelson et al. .............. 361/699 |
| 6,542,364 | B2 | | 4/2003 | Lai et al. |
| 6,698,502 | B1 | * | 3/2004 | Lee ..................... 165/104.26 |
| 6,976,527 | B2 | * | 12/2005 | Kirshberg et al. ...... 165/104.33 |
| 7,000,686 | B2 | * | 2/2006 | Makino et al. ......... 165/104.26 |
| 7,184,265 | B2 | * | 2/2007 | Kim et al. .................. 361/687 |
| 7,218,519 | B2 | * | 5/2007 | Prasher et al. ............. 361/700 |
| 2004/0163796 | A1 | * | 8/2004 | Wu et al. ................. 165/80.4 |
| 2005/0047090 | A1 | * | 3/2005 | Tonosaki et al. ........... 361/700 |
| 2006/0065385 | A1 | * | 3/2006 | Tonosaki et al. ....... 165/104.21 |

FOREIGN PATENT DOCUMENTS

| CN | 1403777 A | 3/2003 |
| CN | 2594507 Y | 12/2003 |

* cited by examiner

Primary Examiner—Tho v Duong
(74) Attorney, Agent, or Firm—Clifford O. Chi

(57) ABSTRACT

A heat dissipation system and a making method thereof are disclosed in accordance with a preferred embodiment. The heat dissipation system mainly includes a body, a cover, and a working fluid. The body includes an evaporation chamber having a first side entryway and a first side outlet, a condensation chamber having a second side entryway and a second side outlet, an elongated evaporation passage configured for intercommunicating the first side outlet with the second side entryway, and an elongated condensation passage configured for intercommunicating the second side outlet with the first side entryway. The cover is hermetically secured to the body. The working fluid is contained in the body.

8 Claims, 7 Drawing Sheets forming a body, the body including an evaporation chamber having a first side entryway and a first side outlet, a condensation chamber having a second side entryway and a second side outlet, an elongated evaporation passage configured for intercommunicating the first side outlet with the second side entryway, and an elongated condensation passage configured for intercommunicating the second side outlet with the first side entryway;

↓ forming a cover

↓ containing a working fluid in the body

↓ hermetically securing the cover to the body

FIG. 5

HEAT DISSIPATION SYSTEM

TECHNICAL FIELD

The present invention relates to heat dissipation devices and, more particularly, to a heat dissipation system and a making method thereof.

BACKGROUND

Nowadays, electronic components, such as central processing units (CPUs), have faster operational speeds and greater functional capabilities, as well as being smaller and more compact than previously. Furthermore, when these electronic components are installed in a cramped location, they may generate much heat due to the limited surrounding air space. Thus, it is desirable to quickly dissipate heat generated by such electronic components in order to maintain relatively stable operation thereof.

Many kinds of heat dissipation devices, such as heat sinks or heat pipes, have been developed for cooling electronic components. A conventional heat sink generally includes a substrate and a number of fins extending from a surface of the substrate. The heat sink has many problems, such as an insufficient heat transfer capacity, noisiness of an associated cooling fan, and a large size and heavy weight. In contrast, a heat pipe is a cooling apparatus having advantages such as no noise of an associated cooling fan, good response to applied heat, and good heat transfer.

Referring to FIGS. 7 and 8, a typical heat pipe 10 generally includes a hermetical shell 102 defining a hollow chamber 103, together with a wick 104 and a working fluid 106. The shell 102 has two opposite sections, i.e., an evaporation section 102a to take in heat, and a condensation section 102b to dissipate heat. The working fluid 106 is contained in the hollow chamber 102. The working fluid 106 is first vaporized in the evaporation section 102a and subsequently condensed in the condensation section 102b thereby transferring heat from the evaporation section 102a to the condensation section 102b. The wick 104 is attached to an inner wall of the shell 102 to draw the condensed working fluid 106 back to the evaporation section 102a. As such, the heat pipe 10 can continuously dissipate heat out from the evaporation section 102a by circulating the working fluid between the two opposite sections 102a and 102b.

In operation, the condensed working fluid 106 generally forms liquid drops on the wick 104, due to gravity and/or capillary action of the wick 104. At the same time, working fluid vapors from the evaporation section 102a diffuse towards the wick 104. Thus, a shear force would be unduly and readily generated at an interface of the diffusing vapors and the liquid drops. In addition, the shell 102 is generally compressed in the two opposite sections 102a and 102b, and the wick 104 adjacent to the condensation section 102b thereby occupies a relatively large inner space in the chamber 103. This increases the shear force and thus decreases fluidity of the liquid and vaporized working fluid 106. Accordingly, the cyclical speed of the working fluid 106 is reduced, thereby decreasing the thermal efficiency of the heat pipe 10. Therefore, the amount of heat dissipated in a given time frame can be expected to decrease.

Furthermore, the two opposite sections of the heat pipe have a limited heat dissipation/absorption area. This further restricts the thermal efficiency of the heat pipe.

What is needed, therefore, is a heat dissipation system which has a relatively high thermal efficiency.

What is needed, therefore, is a making method of the heat dissipation system.

SUMMARY

In a preferred embodiment of the present invention, a heat dissipation system includes a body, a cover, and a working fluid. The body includes an evaporation chamber having a first side entryway and a first side outlet, a condensation chamber having a second side entryway and a second side outlet, an elongated evaporation passage configured for intercommunicating the first side outlet with the second side entryway; and an elongated condensation passage configured for intercommunicating the second side outlet with the first side entryway. The cover is hermetically secured to the body. The working fluid is contained in the body.

A method for making a heat dissipation system includes the steps of forming a body, the body including an evaporation chamber having a first side entryway and a first side outlet, a condensation chamber having a second side entryway and a second side outlet, an elongated evaporation passage configured for intercommunicating the first side outlet with the second side entryway, and an elongated condensation passage configured for intercommunicating the second side outlet with the first side entryway; forming a cover; containing a working fluid in the body; and hermetically securing the cover to the body.

Other advantages and novel features will become more apparent from the following detailed description of embodiments when taken in conjunction with the accompanying drawings.

BRIEF DESCRIPTION OF THE DRAWINGS

Many aspects of the heat dissipation system can be better understood with reference to the following drawings. The components in the drawings are not necessarily to scale, the emphasis instead being placed upon clearly illustrating the principles of the present heat dissipation system. Moreover, in the drawings, like reference numerals designate corresponding parts throughout the several views.

FIG. 5 is a schematic flow chart of a method for making the heat dissipation system of FIG. 2;

DETAILED DESCRIPTION OF THE EMBODIMENTS

Embodiments of the present heat dissipation system now be described in detail below with reference to the drawings.

Figure 1:
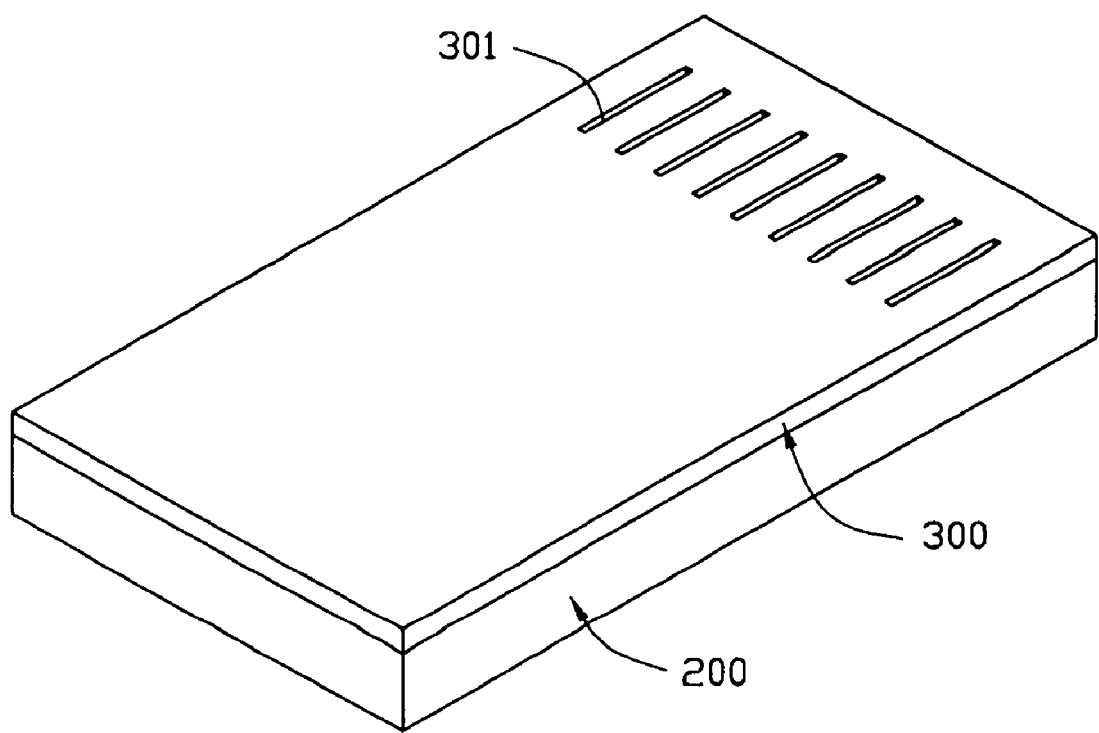
FIG. 1 is a schematic perspective view of a heat dissipation system in according with a preferred embodiment.
Figure 2:
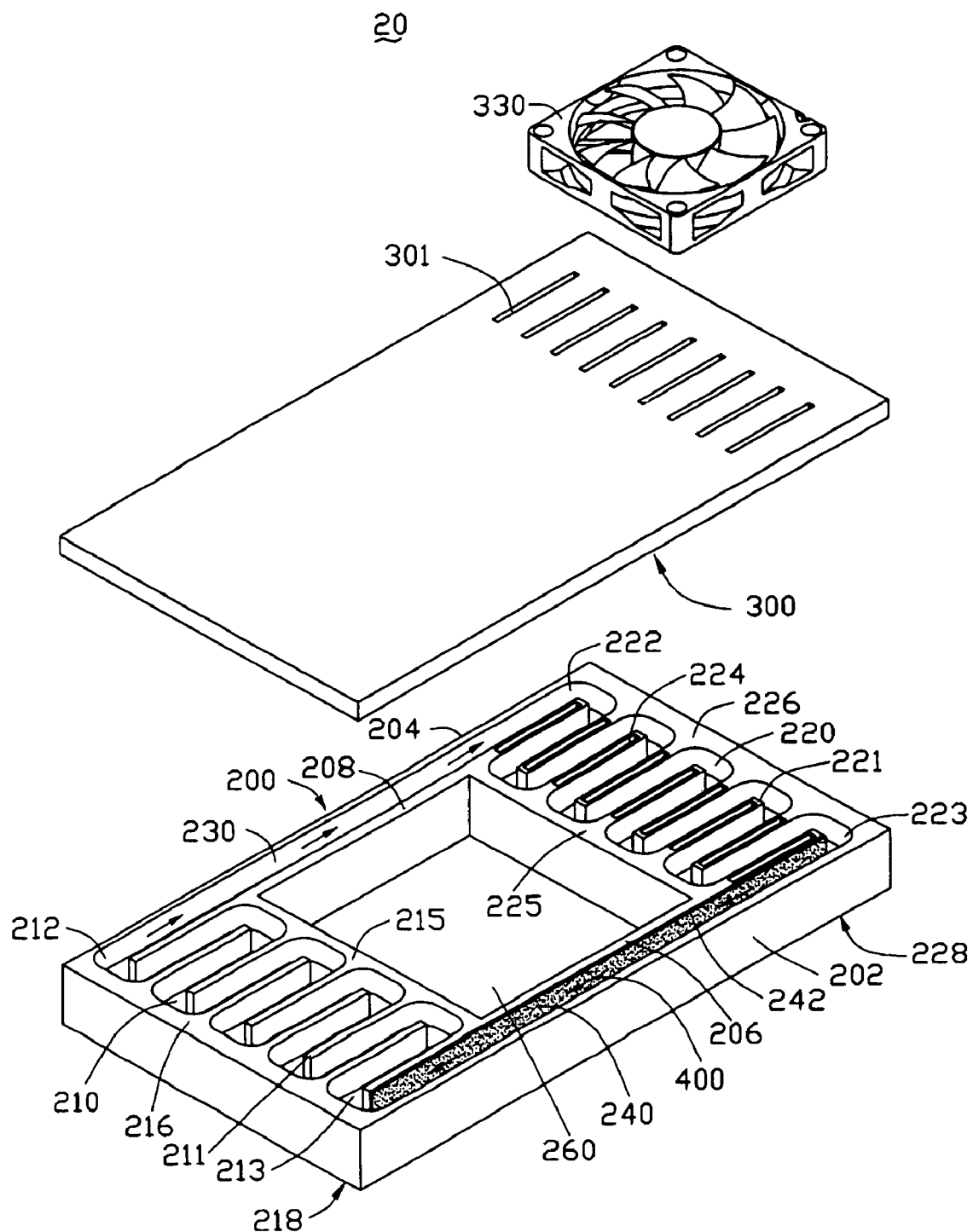
FIG. 2 is a partially disassembled perspective view of the heat dissipation system of FIG. 1.

FIGS. 1 and 2 illustrate a heat dissipation system 20 in accordance with an exemplary embodiment. The heat dissipation system 20 includes a body 200, a cover 300, and a working fluid 400. The cover 300 is hermetically secured to the body 200. The working fluid 400 is contained in the body 200.

The body 200 mainly includes an evaporation chamber 210, a condensation chamber 220, an elongated evaporation passage 230, an elongated condensation passage 240, and a condensation exterior sidewall 202, an evaporation exterior sidewall 204, a condensation interior sidewall 206, and an evaporation interior sidewall 208. The evaporation and condensation passages 230, 240 are advantageously essentially parallel to each other and could be linear or curve passages. The evaporation passage 230 is interposed between the evaporation chamber 210 and the condensation chamber 220 to communicate the working fluid 400 therebetween. The evaporation passage 230 is advantageously defined between the evaporation exterior sidewall 204 and the evaporation interior sidewall 208. The condensation passage 240 is interposed between the evaporation chamber 210 and the condensation chamber 220 to communicate the working fluid 400 therebetween. The condensation passage 240 is advantageously defined between the condensation exterior sidewall 202 and the condensation interior sidewall 206.

Advantageously, the body 200 can be generally cuboid-shaped, with a cubage in the approximate range from 5 centimeters×5 centimeters×5 centimeters to 10 centimeters×10 centimeters×15 centimeters. The body 200 can have a low pressure inside. The body 200 could be made of, for example, a thermally conductive material selected from the group consisting of: copper, aluminum, iron, nickel, alumina, aluminum nitride, and combinations thereof.

The evaporation chamber 210 mainly includes a first side outlet 212, a first side entryway 213, a first interior sidewall 215, a first exterior sidewall 216 opposite to the first interior sidewall 215, a plurality of first spacer plates 211, and a first substrate 218. The first interior sidewall 215 is located between and adjoins both the condensation and evaporation interior sidewalls 206, 208. The first exterior sidewall 216 is located between and adjoins both the condensation and evaporation exterior sidewalls 202, 204. The first substrate 218 is beneficially configured for thermally coupling to a desired heat source (not shown) that typically has a flat surface. Heat generated from the heat source can thereby be efficiently transferred to the evaporation chamber 210 due to a large surface area of the first substrate 218.

Advantageously, the first spacer plates 211 are arranged uniformly inside the evaporation chamber 210 and are configured for forming a periphrastic passage inside the evaporation chamber 210. For example, the first spacer plates 211 alternately extends from the first interior and exterior sidewalls 215, 216 and are apart from the respective first exterior/interior sidewalls 215/216, thereby forming a periphrastic passage inside the evaporation chamber 210. This periphrastic passage is helpful for the working fluid 400 to fully exchange heat with the heat source, as well as with the first spacer plates 211, thereby increasing thermal efficiency of the system 20.

Each of the first spacer plates 211 advantageously has a height essentially equal to an inner height of the evaporation chamber 210. Thus, when the cover 300 is secured to the body 200, each of the first spacer plates 211 water tightly adjoins the first substrate 218 and the cover 300. Accordingly, the working fluid 400 would substantially flow through the evaporation chamber 210 along the periphrastic passage. The first spacer plates 211 are advantageously parallel to each other and are perpendicular or oblique to the first interior and exterior sidewalls 215 and 216.

In the illustrated embodiment, the first spacer plates 211 is a solid flat plate. The first spacer plates 211 each, advantageously, define a plurality of microstructures, e.g., grooves, projections, or orifices, for increasing thermal contact area between the working fluid 400 and the first spacer plates 211. Alternatively, the first spacer plates 211 could be a crooked plate, for further increasing thermal contact area between the working fluid 400 and the first spacer plates 211.

The first side outlet 212 is advantageously defined between the evaporation exterior sidewall 204 and an extreme first spacer plate 211 adjacent the evaporation exterior sidewall 204. The first side entryway 213 is advantageously defined between the condensation interior sidewall 202 and another extreme first spacer plate 211 adjacent the condensation interior sidewall 202. The first side outlet 212 is in communication with the evaporation passage 230. The first side entryway 213 is in communication with the condensation passage 240.

The condensation chamber 220 has a structure essentially similar to the evaporation chamber 210, e.g., mainly including a plurality of second spacer plates 221, a second side entryway 222, a second side outlet 223, a second interior sidewall 225 and a second exterior sidewall 226, and a second substrate 228. The second side entryway 222 is advantageously defined between the evaporation exterior sidewall 204 and an extreme second spacer plate 221 adjacent the evaporation exterior sidewall 204 and is in communication with the evaporation passage 230. The second side outlet 223 is advantageously defined between the condensation exterior sidewall 202 and another extreme second spacer plate 221 adjacent the condensation exterior sidewall 202 and is advantageously in communication with the condensation passage 240.

The same to the first spacer plates 211, the second spacer plates 221 alternately extend from the second interior and exterior sidewalls 225, 226 and are apart from respective first interior/exterior sidewalls 225/226, thereby forming another periphrastic passage inside the condensation chamber 220. Otherwise, the second spacer plates 221 each advantageously define an opening cavity 224 towards the cover 300. Accordingly, the cover 300 advantageously defines a plurality of airflow orifices 301 each gaseous communicating with one respective cavity 224, for facilitating heat dissipation via air convection.

Figure 3:
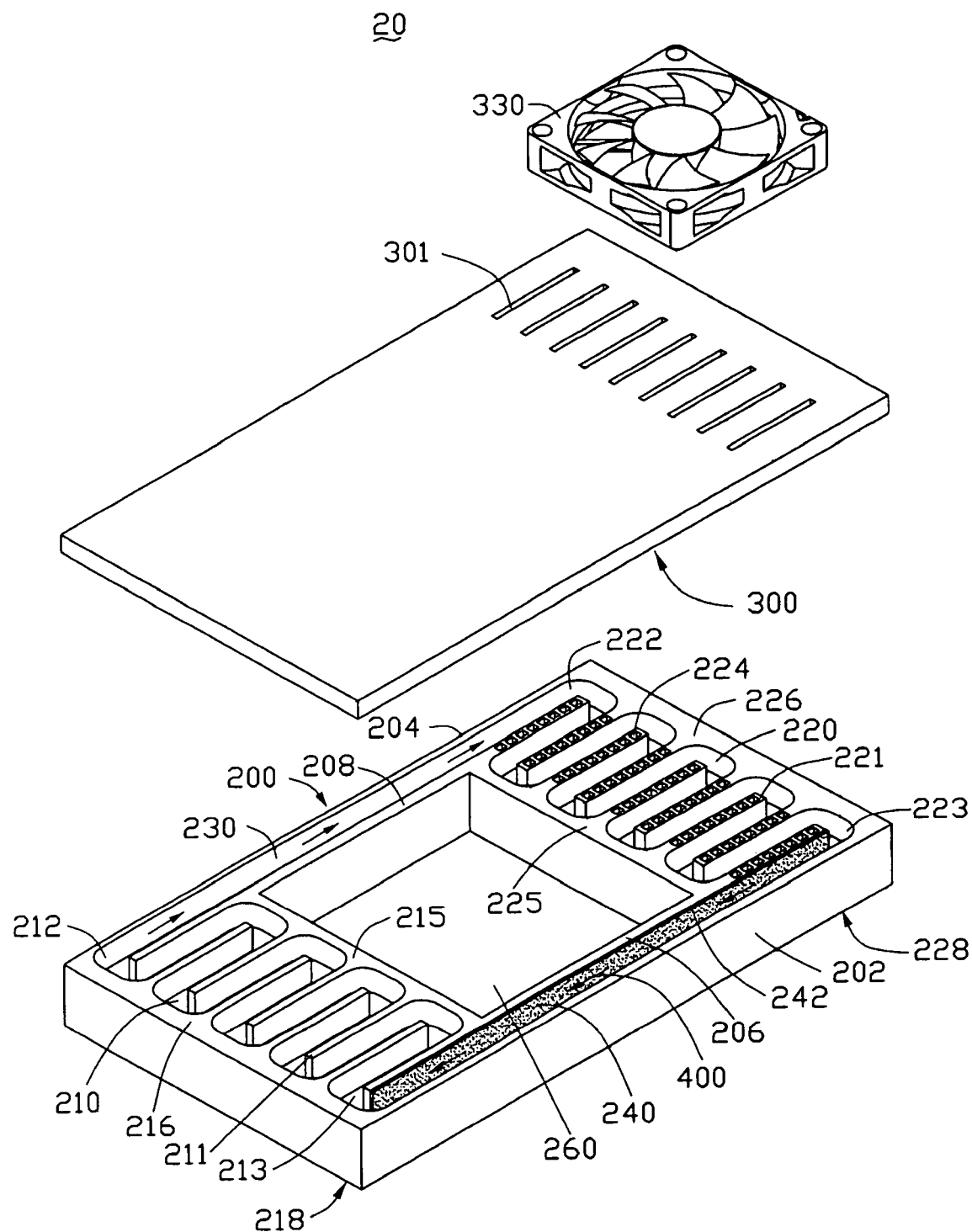
FIG. 3 is essentially similar to FIG. 2, but showing a plurality of cavities defined in each second spacer plate of the heat dissipation system of FIG. 2.

Alternatively, each of the second spacer plates 221 advantageously defines a plurality of opening cavities 224 towards the cover 300, as shown in FIG. 3. The opening cavities 224 could advantageously be uniformly arranged on each second spacer plate 221. Accordingly, each of the airflow orifices 301 defined on the cover 300 is advantageously in gas communication with opening cavities 224 on one respective second spacer plate 221.

The first and second spacer plates 211, 221 are advantageously comprised of, for example, a thermally conductive material selected from the group consisting of: copper, aluminum, iron, nickel, alumina, aluminum nitride, and combinations thereof.

Furthermore, as shown in FIGS. 2 and 3, the condensation and evaporation interior sidewalls 206, 208 and the first interior and second interior sidewalls 215, 225 cooperatively define an opening 260. The opening 260 is advantageously in gas communication with the outside environment thereby facilitating heat dissipation of the evaporation chamber 210 via natural air convection. Preferably, a cooling member (not shown) is applied in the opening 260 to promoting the air convection therein. Alternatively, in another embodiment, the first interior and second interior sidewalls 215, 225 are adjacent back to back thereby closely adjoining the two chambers 210, 220 without the opening 260 therebetween.

Figure 4:
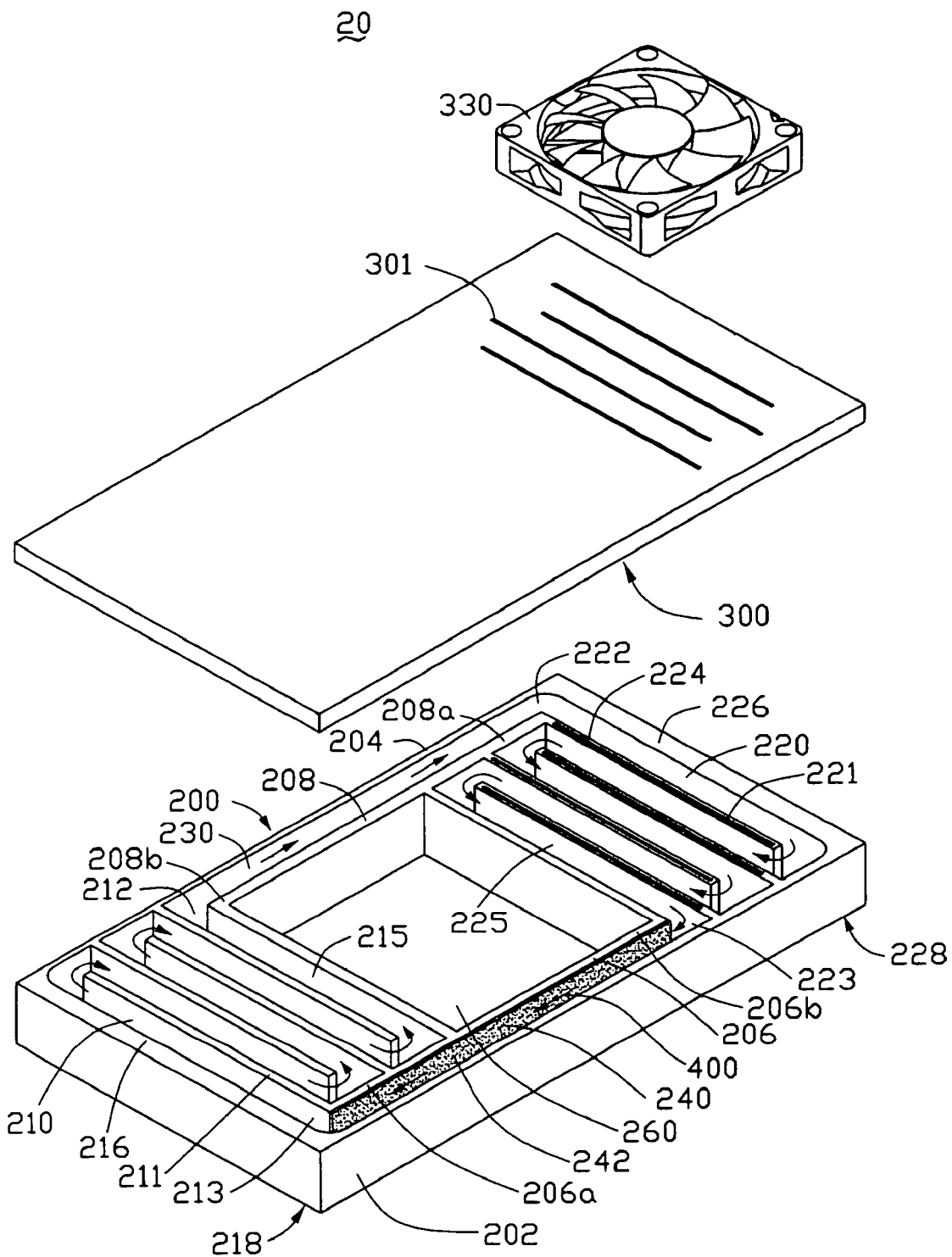
FIG. 4 is essentially similar to FIG. 2, but showing an alternative exemplary arrangement of the first and second spacer palters in an evaporation and condensation chambers of the heat dissipation system of FIG. 2.

FIG. 4 illustrates an alternative exemplary arrangement of the first and second spacer palters 211, 221 in the evaporation and condensation chambers 210, 220. The first spacer plates 211 are configured for being parallel to the first interior and exterior sidewalls 215, 216. The condensation interior sidewall 206 has an end portion 206a extending into the evaporation chamber 210 and an opposing end 206b adjacent the second interior sidewall 225. The evaporation interior sidewall 208 has end portion 208a extending into the condensation chamber 220 and an opposing end 208b adjacent the first interior sidewall 215. The first spacer plates 211 alternately extend from the evaporation exterior sidewall 204 and the extending end portion 206a of the condensation interior sidewalls 206. Similarly, the second spacer plates 221 alternately extend from the condensation exterior sidewall 202 and the extending end portion 208a of the evaporation interior sidewalls 208. As such, two alternative periphrastic passages are formed in the evaporation and condensation chambers 210, 220, respectively.

In this alternative example, the first side entryway 213 is defined between an extreme first spacer plate 211 and the first exterior sidewall 216. The first side outlet 212 is defined between another opposing extreme first spacer plate 211 and the first interior sidewall 215. The airflow orifices 301 are advantageously parallel to and in communication with one respective cavity 224 of the second spacer plates 221.

The working fluid 400 is advantageously a liquid having properties, such as, for example, high phase change latent heat, good fluidity, steady chemical characteristics, and low boiling point. The working fluid 400 could, advantageously, be selected from the group consisting of water, methanol, alcohol, acetone, ammonia, heptane, etc. Preferably, the working fluid 400 has some nano-particles admixed thereinto, for improving heat conductivity thereof. The nano-particles could advantageously be a thermally conductive material, such as, for example, carbon nanotubes, carbon nanocapsules, nano-sized copper particles, or any suitable mixtures thereof. The nano-particles beneficially occupy about 0.5 to 2 percent by weight in the working fluid 400.

Furthermore, a fan 330 can, advantageously, be applied to the airflow orifices 301, for promoting the cooling effect to the spacer plates 221, as shown in FIG 4. A wick 242 can, advantageously, be formed on inner walls of the condensation passage 240, for drawing the working fluid 400 in the condensation chamber 220 back to the evaporation chamber 210 via a capillary action of the wick 242. The wick 242 can be comprised of a porous material, such as, for example, carbon fibers, carbon nanotubes, sintered copper powder, or metal mesh. Alternatively, the wick 242 can be a plurality of grooves. Furthermore, a pump can be disposed in the condensation passage 240, for accelerating circulation of the working fluid 400.

FIG. 5 illustrates a method for making the above-described heat dissipation system 20. The method could be, for example, an injection molding method, a stamping method, a welding method, a hot-press method, or a combination thereof. In brief, the molding method mainly includes the steps of: forming a body, the body including an evaporation chamber having a first side entryway and a first side outlet, a condensation chamber having a second side entryway and a second side outlet, an elongated evaporation passage configured for intercommunicating the first side outlet with the second side entryway, and an elongated condensation passage configured for intercommunicating the second side outlet with the first side entryway; forming a cover; putting a working fluid in the body; and hermetically securing the cover to the body.

The formation of the body 200 could advantageously be performed, e.g., by an injection molding method, a welding method, a hot-press method, or their combinations. The evaporation chamber 210, the condensation chamber 220, the evaporation passage 230, and the condensation passage 240 are, advantageously, simultaneously formed by one of above-mentioned methods. Then, the first and second spacer plates 211, 221 are correspondingly formed in the evaporation chamber 210 and the condensation chamber 220 by a method, such as, for example, a molding method, a welding method, a hot-press method, or a splicing method. The cavities 224 could advantageously be formed on the second spacer plates 221 by a method, such as, for example, a stamping method, a hot-press method, or an etching method.

Alternatively, the first and second spacer plates 211, 221 are simultaneously formed together with the evaporation chamber 210, the condensation chamber 220, the evaporation passage 230, and the condensation passage 240 by the above-mentioned making method of the body 200.

For example, the evaporation chamber 210, the condensation chamber 220, the evaporation passage 230, and the condensation passage 240 could be firstly formed by a hot-press method. Then, the first and second spacer plates 211, 221 are welded to the evaporation chamber 210 and the condensation chamber 220. The second spacer plates 221 are etched to form a plurality of corresponding cavities 224 thereon.

After formation of the body 200, the working fluid 400 is sequentially contained therein. Then, the cover 300 could be formed, e.g., a stamping method, an injection molding method, a hot-press method, or their combinations. For example, the cover 300 could be formed by a stamping method, and a plurality of airflow orifices 301 is sequentially formed thereon by a hot-press method. Alternatively, the working fluid 400 is sequentially contained in the body 200 after formation of the cover 300.

The cover 300 is hermetically secured to the body 200 at a low-pressure circumstance by an engagement method, for example, a welding method, a hot-press method, or a splicing method.

Alternatively, the cover 300 could be hermetically secured to the body 200 by a flexible engagement configuration formed on the cover 300 and/or the body 200. For example, the cover 300 and the body 200 could form corresponding wedge grooves or fixing hooks on edges thereof to attain the securing of the cover 300. In other embodiments, the cover 300 could be hermetically secured to the body 200 by a bolt or a screw.

Furthermore, during the securing step, a seal material could advantageously be cooperatively applied to an interface between the body 200 and the cover 300, for enhancing watertight effect between the two combined members 200, 300.

Figure 6:
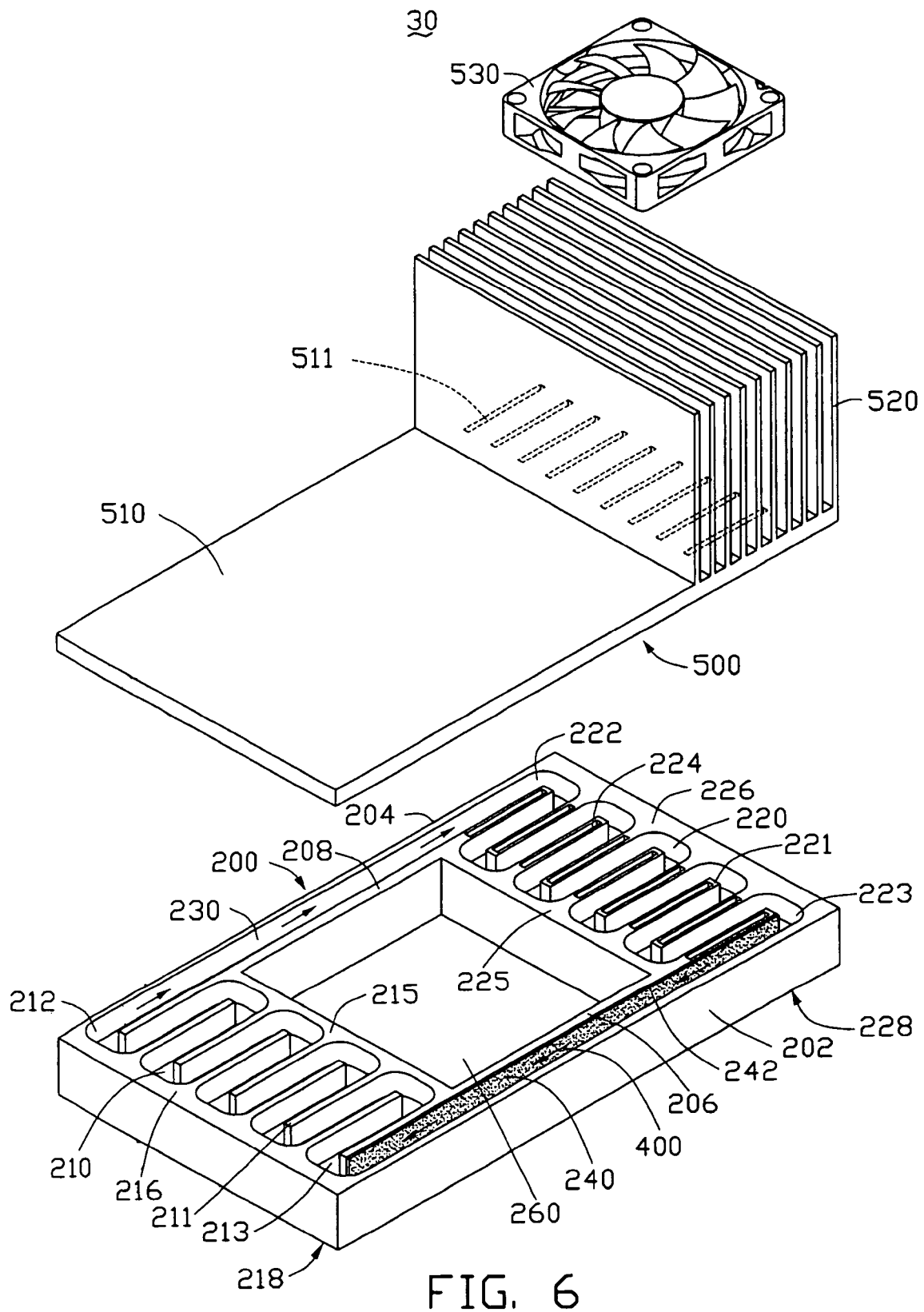
FIG. 6 is a partially disassembled perspective view of a heat dissipation system in according with another preferred embodiment.
Figure 7:
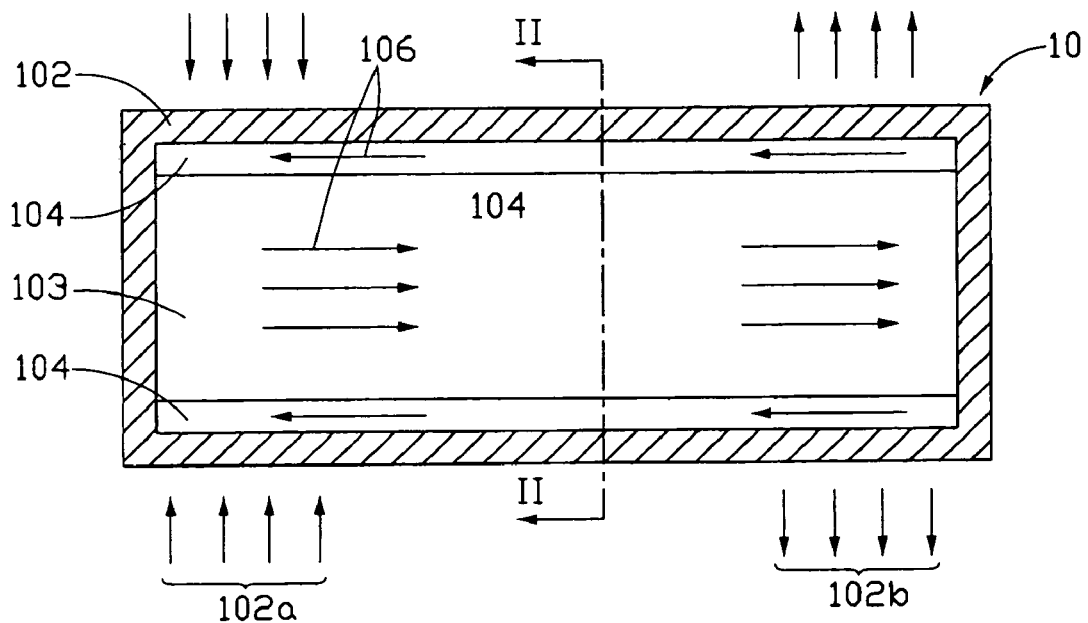
FIG. 7 is a schematic, cross-section view of a conventional heat pipe.
Figure 8:
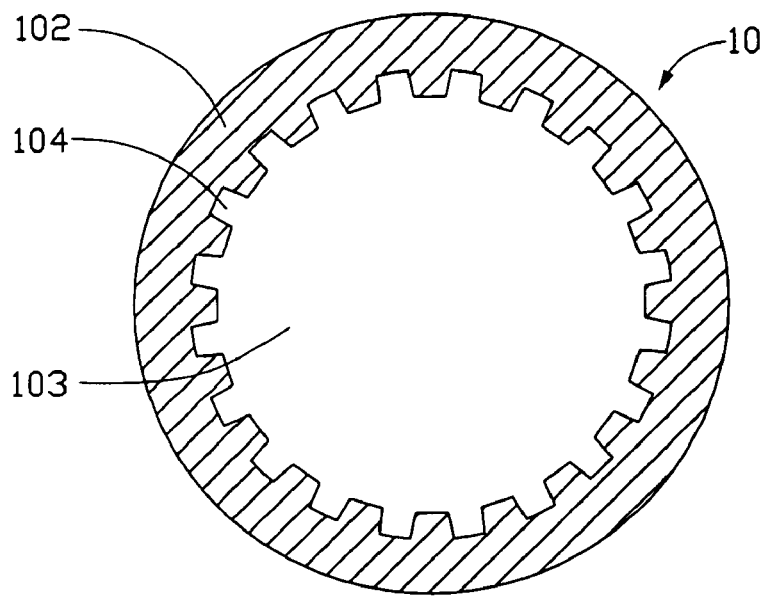
FIG. 8 is a schematic, cross-section view taken along a line II-II of the heat pipe of FIG. 7.

FIG. 6 illustrates a heat dissipation system 30 in accordance with another preferred embodiment. The heat dissipation system 30 has an essentially similar structure to the heat dissipation system 20, e.g., including the body 200 of the heat dissipation system 20 and a cover 500 essentially similar to the cover 300 of heat dissipation system 20.

In this embodiment, in addition to a cover substrate 510 and a plurality of airflow orifices 511, the cover 500 otherwise includes a plurality of fins 520 disposed adjacent the condensation chamber 220. The fins 520 are advantageously parallel to one another and are beneficially perpendicular to the airflow orifices 511. In an alternative embodiment, the fins 520 could be parallel to and apart from the airflow orifices 511. In another alternative embodiment, the fins 520 could be secured into the opening cavities 224 of the second spacer plates 221 across the airflow orifices 511, thereby directly transferring heat from the second spacer plates 221 to the fins 520, and sequentially radiating heat to outside environment therefrom.

Furthermore, a fan 530 could, advantageously, be secured on the fins 520, for promoting the cooling effect to the fins 520.

The heat dissipation system 30 could be made by a method essentially similar to the above-mentioned making method of heat dissipation system 20. In this embodiment, in addition to all the steps of making the dissipation system 20, an otherwise step of forming a plurality of fins 520 on the cover 500 is performed. The formation method of the fins 520 could, advantageously, be a welding method or an extrusion molding method. Alternatively, the fins 520 could be simultaneously formed during the formation of the cover substrate 510.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation system, comprising:
    a body comprising:
        an evaporation chamber having a first side entryway and a first side outlet, the evaporation chamber comprising a first interior sidewall and a first exterior sidewall opposite to the first interior sidewall, and a plurality of first spacer plates alternately extending from the first interior and exterior sidewalls to form a long passage inside the evaporation chamber;
        a condensation chamber having a second side entryway and a second side outlet, the condensation chamber comprising a plurality of second spacer plates for forming a long passage inside the condensation chamber, each of the second spacer plates defining at least one opening cavity;
        an elongated evaporation passage intercommunicating the first side outlet with the second side entryway; and
        an elongated condensation passage intercommunicating the second side outlet with the first side entryway;
    a cover hermetically secured to the body and facing towards the at least one opening cavity of each of the second spacer plates inside the condensation chamber, the cover defining a plurality of airflow orifices each fluidly communicating with the at least one cavity of one respective second spacer plate; and
    a working fluid contained in the body.

2. The heat dissipation system of claim 1, wherein the first spacer plates are parallel to one another and are arranged regularly inside the evaporation chamber.

3. The heat dissipation system of claim 1, wherein the second spacer plates are parallel to one another and are arranged regularly inside the condensation chamber.

4. The heat dissipation system of claim 1, wherein the condensation chamber comprises a second interior sidewall and a second exterior sidewall opposite to the second interior sidewall, the second spacer plates alternately extending from the second interior and exterior sidewalls.

5. The heat dissipation system of claim 1, further comprising a plurality of fins formed on the cover adjacent the airflow orifices.

6. The heat dissipation system of claim 1, further comprising a fan disposed adjacent the condensation chamber.

7. The heat dissipation system of claim 1, further comprising a wick applied to inner walls of the condensation passage.

8. The heat dissipation system of claim 1, further comprising a pump disposed in the condensation chamber for accelerating circulation of the working fluid between the condensation chamber and the evaporation chamber.

* * * * *